(12) United States Patent
Pan

(10) Patent No.: US 10,688,769 B2
(45) Date of Patent: Jun. 23, 2020

(54) FILM-REMOVING DEVICE

(71) Applicants: Hefei Xinsheng Optoelectronics Technology Co., Ltd., Hefei (CN); BOE Technology Group Co., Ltd., Beijing (CN)

(72) Inventor: Tianfeng Pan, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/335,031

(22) PCT Filed: Mar. 29, 2018

(86) PCT No.: PCT/CN2018/081112
§ 371 (c)(1),
(2) Date: Mar. 20, 2019

(87) PCT Pub. No.: WO2018/223756
PCT Pub. Date: Dec. 13, 2018

(65) Prior Publication Data
US 2019/0248126 A1    Aug. 15, 2019

(30) Foreign Application Priority Data

Jun. 9, 2017   (CN) ..................... 2017 2 0672453 U

(51) Int. Cl.
*B32B 43/00* (2006.01)
*H01L 27/32* (2006.01)
(Continued)

(52) U.S. Cl.
CPC ........ *B32B 43/006* (2013.01); *H01L 27/3244* (2013.01); *H01L 51/00* (2013.01);
(Continued)

(58) Field of Classification Search
CPC . B32B 38/10; B32B 43/006; Y10T 156/1174; Y10T 156/195
(Continued)

(56) References Cited

U.S. PATENT DOCUMENTS 5,653,850 A * 8/1997 Watanabe ........... B29C 63/0013
156/715
6,258,666 B1 * 7/2001 Mizutani ................. C23C 16/01
438/258
(Continued)

FOREIGN PATENT DOCUMENTS

CN    105655487 A *  6/2016  ............. B32B 38/10
CN    206781204 U    12/2017

OTHER PUBLICATIONS

May 18, 2018—(WO) International Search Report and Written Opinion Appn PCT/CN2018/081112 with English Translation.
(Continued)

*Primary Examiner* — Mark A Osele
*Assistant Examiner* — Nickolas R Harm
(74) *Attorney, Agent, or Firm* — Banner & Witcoff, Ltd.

(57) ABSTRACT

A film-removing device, includes: a load-bearing platform including a load-bearing surface; a film-removing roller provided at one side close to the load-bearing surface of the load-bearing platform, a central axis of the film-removing roller being parallel to the load-bearing surface of the load-bearing platform; a rotation driver connected to the film-removing roller and configured to drive the film-removing roller to rotate around a central line parallel to the central axis of the film-removing roller, such that an edge of the film-removing roller close to the load-bearing surface moves within the load-bearing surface of the load-bearing platform.

18 Claims, 4 Drawing Sheets

(51) Int. Cl.
  *H01L 51/00* (2006.01)
  *H01L 51/56* (2006.01)
  *H01L 51/52* (2006.01)
  *B32B 38/10* (2006.01)

(52) U.S. Cl.
  CPC ........ *H01L 51/003* (2013.01); *H01L 51/5243* (2013.01); *H01L 51/56* (2013.01); *B32B 38/10* (2013.01); *B32B 2457/206* (2013.01); *H01L 2227/326* (2013.01); *Y10T 156/1174* (2015.01); *Y10T 156/195* (2015.01)

(58) Field of Classification Search
  USPC .................................................. 156/715, 759
  See application file for complete search history.

(56) References Cited

U.S. PATENT DOCUMENTS

| | | | | |
|---|---|---|---|---|
| 8,142,610 | B2 * | 3/2012 | Tani | B08B 7/00 156/715 |
| 9,377,634 | B2 * | 6/2016 | Zhang | G02F 1/1303 |
| 2008/0185100 | A1 * | 8/2008 | Jang | B32B 43/006 156/714 |
| 2008/0236743 | A1 * | 10/2008 | Kye | B29C 63/0013 156/714 |
| 2009/0288760 | A1 * | 11/2009 | Garben | B41J 29/38 156/230 |
| 2014/0290864 | A1 * | 10/2014 | Ahn | B32B 43/006 156/379.8 |
| 2015/0151531 | A1 * | 6/2015 | Ohno | B32B 43/006 156/755 |
| 2016/0159069 | A1 * | 6/2016 | Huang | B32B 43/006 156/707 |
| 2018/0117896 | A1 | 5/2018 | Peng et al. | |

OTHER PUBLICATIONS

Xiangbai, Mathematical Nutritional Vegetable—Useful Arc Triangle, "Chinese Famous Science Masterpieces Interesting Math Album Mathematics Nutrition Dishes", China Children's Publishing House Jan. 31, 2012, pp. 173-175.

* cited by examiner

FILM-REMOVING DEVICE

The application is a U.S. National Phase Entry of International Application No. PCT/CN2018/081112 filed on Mar. 29, 2018, designating the United States of America and claiming priority to Chinese Patent Application No. 201720672453.8 filed on Jun. 9, 2017. The present application claims priority to and the benefit of the above-identified applications and the above-identified applications are incorporated by reference herein in their entirety.

TECHNICAL FIELD

Embodiments of the present disclosure relate to a film-removing device.

BACKGROUND

In a field of processing technology of display devices, a preparation process of packaging materials is an important link affecting the quality of display devices. For example, in a metal packaging process of an OLED (Organic Light-Emitting Diode) display device, the quality of a metal packaging film formed after attaching an organic film and a metal film may affect the quality of the OLED display device.

Currently, as illustrated in FIG. 1, a side of an organic film 200 is usually provided with a protective film 300. In a process of manufacturing the metal packaging film, firstly, a surface of the organic film 200, on which the protective film 300 is not disposed, is attached to a metal film 100 to form a metal packaging film; then the protective film 300 is removed from the organic film 200, so as to attach the metal packaging film to the display panel. However, because the adhesive force between the protective film 300 and the organic film 200 is greater than the adhesive force between the organic film 200 and the metal film 100, as illustrated in FIG. 1, in a process of removing the protective film 300, the organic film 200 is easy to be taken up and the organic film 200 is separated from the metal film 100, so that the protective film 300 cannot be removed, and the metal packaging film is scrapped.

SUMMARY

At least one embodiment of the present disclosure provides a film-removing device capable of reducing the possibility of taking up an organic film upon removing a protective film on a metal packaging film, and reducing the scrap rate of the metal packaging film.

Embodiments of the present disclosure provide a film-removing device, including a load-bearing platform including a load-bearing surface; a film-removing roller, provided on a side of the load-bearing platform close to the load-bearing surface, a central axis of the film-removing roller being parallel to the load-bearing surface of the load-bearing platform; a rotation driver, connected to the film-removing roller, and configured to drive the film-removing roller to rotate around a central line parallel to the central axis of the film-removing roller, such that an edge of the film-removing roller close to the load-bearing surface moves within the load-bearing surface of the load-bearing platform.

For example, in the film-removing device provided by an embodiment of the present disclosure, a shape of a cross section of the film-removing roller is a reuleaux triangle.

For example, the film-removing device provided by an embodiment of the present disclosure further includes a horizontal moving assembly. The horizontal moving assembly is configured to drive the rotation driver or the load-bearing platform to move in a direction perpendicular to the central axis of the film-removing roller and parallel to the load-bearing surface.

For example, the film-removing device provided by an embodiment of the present disclosure further includes a vertical moving assembly. The vertical moving assembly is configured to drive the rotation driver or the load-bearing platform to move in a direction perpendicular to the central axis of the film-removing roller and perpendicular to the load-bearing surface.

For example, in the film-removing device provided by an embodiment of the present disclosure, the rotation driver includes a sub-driving assembly connected to an end of the film-removing roller, the sub-driving assembly includes a rotation motor and a turntable, the rotation motor is configured to drive the turntable to rotate around a central axis thereof, the end of the film-removing roller is connected to an acentric position of the turntable, and the central axis of the turntable is parallel to the central axis of the film-removing roller.

For example, in the film-removing device provided by an embodiment of the present disclosure, the rotation driver includes two sub-driving assemblies respectively connected to two ends of the film-removing roller and configured to drive the two ends of the film-removing roller to rotate synchronously around the central line.

For example, in the film-removing device provided by an embodiment of the present disclosure, each sub-driving assembly includes a rotation motor and a turntable, the rotation motor is configured to drive the turntable to rotate around a central axis thereof, an end of the film-removing roller is connected to an acentric position of the turntable, and the central axis of the turntable is parallel to the central axis of the film-removing roller.

For example, in the film-removing device provided by an embodiment of the present disclosure, a sidewall of the film-removing roller is provided with a connection structure, the connection structure is configured to connect to a protective film on a surface of the metal packaging film.

For example, in the film-removing device provided by an embodiment of the present disclosure, the connection structure includes an adhesive tape, an end of the adhesive tape is detachably connected to the sidewall of the film-removing roller.

For example, in the film-removing device provided by an embodiment of the present disclosure, the film-removing roller includes a first clamping plate, a second clamping plate and a driving mechanism, the driving mechanism is connected between the first clamping plate and the second clamping plate, and configured to drive the first clamping plate and the second clamping plate to clamp or open, and upon the first clamping plate and the second clamping plate being clamped, an end edge of the adhesive tape is clamped between the first clamping plate and the second clamping plate.

For example, in the film-removing device provided by an embodiment of the present disclosure, the protective film covers on a metal packaging film.

For example, the film-removing device provided by an embodiment of the present disclosure further includes a heating assembly. The heating assembly is configured to heat the film-removing roller.

For example, in the film-removing device provided by an embodiment of the present disclosure, an elongated hole is formed in the film-removing roller, and the elongated hole extends from one end of the film-removing roller to the other end of the film-removing roller, and the heating assembly includes a heating tube having a strip shape and installed in the elongated hole.

For example, in the film-removing device provided by an embodiment of the present disclosure, a length of the heating tube matches a length of the elongated hole.

At least one embodiment of the present disclosure provides a film-removing device, firstly, the metal packaging film is placed on the load-bearing surface of the load-bearing platform and the protective film on the metal packaging film is disposed on a side of the metal packaging film away from the load-bearing surface; secondly, the film-removing roller is horizontally moved relative to the load-bearing platform in a direction perpendicular to the central axis of the film-removing roller and parallel to the load-bearing surface to above of a first end edge of the metal packaging film, and a lower edge of the film-removing roller is in contact with an upper surface of the metal packaging film; and then the protective film is fixed to the film-removing roller, and the rotation driver is activated to drive the film-removing roller to make a circular motion around the center line parallel to the central axis of the film-removing roller, simultaneously, the film-removing roller is horizontally moved relative to the load-bearing platform toward a second end of the metal packaging film in a direction perpendicular to the central axis of the film-removing roller and parallel to the load-bearing surface, to roll and remove the protective film on the metal packaging film. Because the cross section of the film-removing roller is a reuleaux triangle, the reuleaux triangle has a constant width, so that the metal packaging film is always pressed by the film-removing roller without warping, a possibility of taking up an organic film in the metal packaging film upon removing the protective film is greatly reduced, and the scrap rate of the metal packaging film is reduced; on the other hand, the reuleaux triangle includes three corners, and upon the protective film being removed through the three corners, the protective film has a large peeling angle, and the protective film is easily peeled off.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

REFERENCE NUMERALS

100—metal film; 200—organic film; 300—protective film; 1—load—bearing platform; 10—load-bearing surface; 2—film—removing roller; 3—rotation driver; 301, 302—sub-driving assembly; 400—central line; 31—rotation motor; 32—turntable; 500—central axis of the film-removing roller; 33—first connecting shaft; 4—second connecting shaft; 5—connection structure; 21—first clamping plate; 22—second clamping plate; 7—driving mechanism; 6—heating assembly.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "include," "including," "include," "including," etc., are intended to specify that the elements or the objects stated before these terms encompass the elements or the objects and equivalents thereof listed after these terms, but do not preclude the other elements or objects. "On," "under," "right," "left" and the like are only used to indicate relative position relationship, and when the position of the object which is described is changed, the relative position relationship may be changed accordingly.

Figure 1:
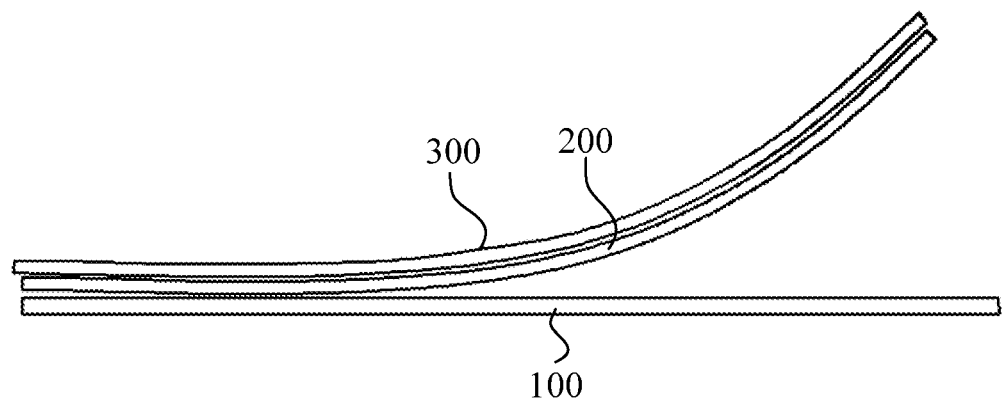
FIG. 1 is a structure view of taking up an organic film upon removing the protective film on the metal packaging film.
Figure 2:
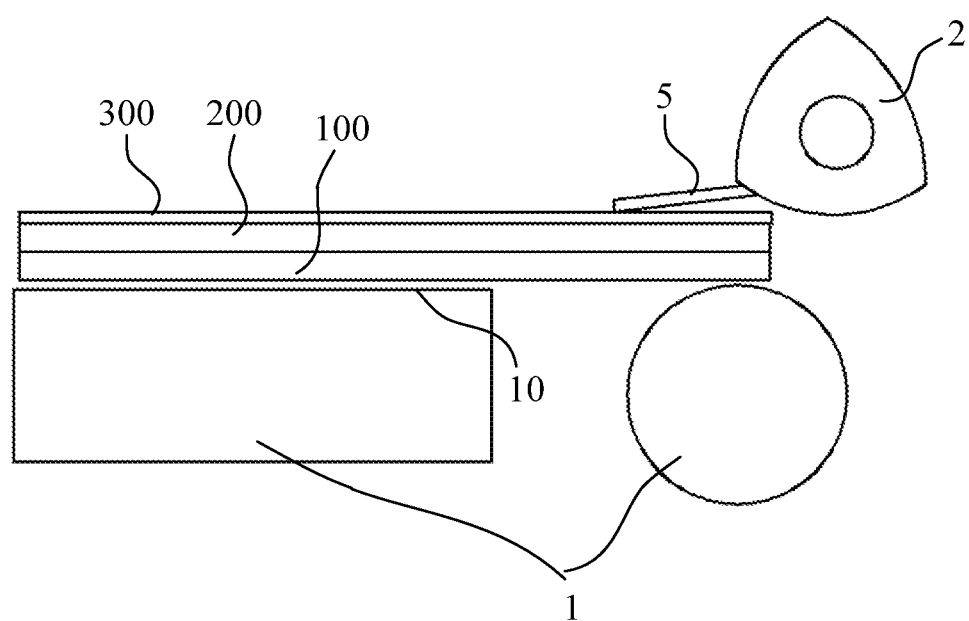
FIG. 2 is a first structure view of a film-removing device provided by an embodiment of the present disclosure.
Figure 3:
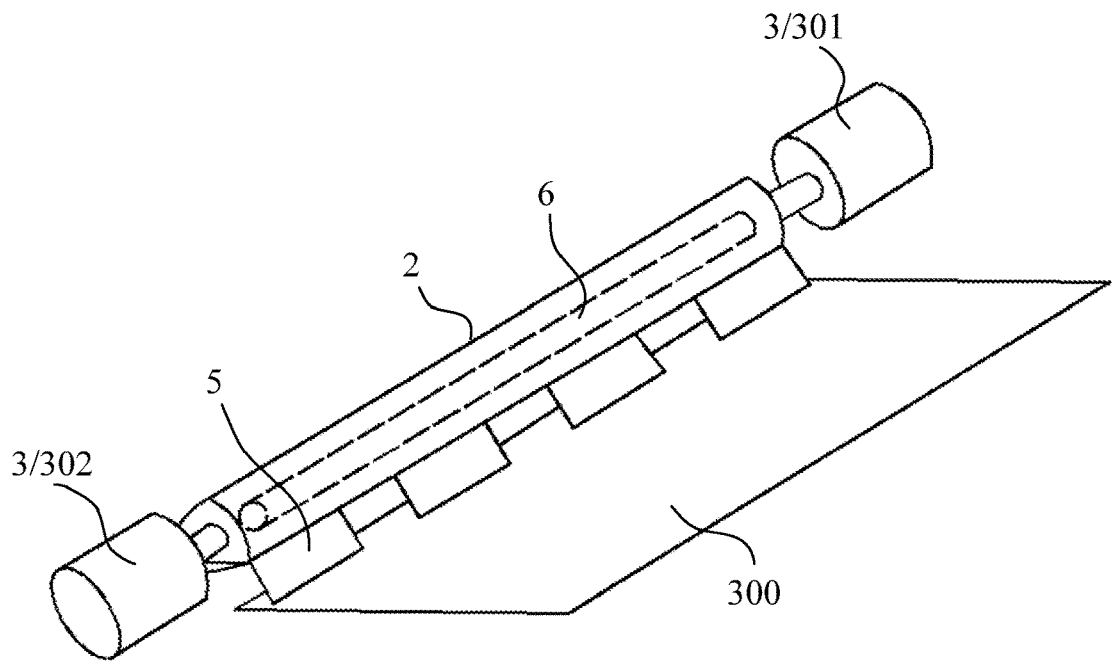
FIG. 3 is a second structure view of a film-removing device provided by an embodiment of the present disclosure.
Figure 4:
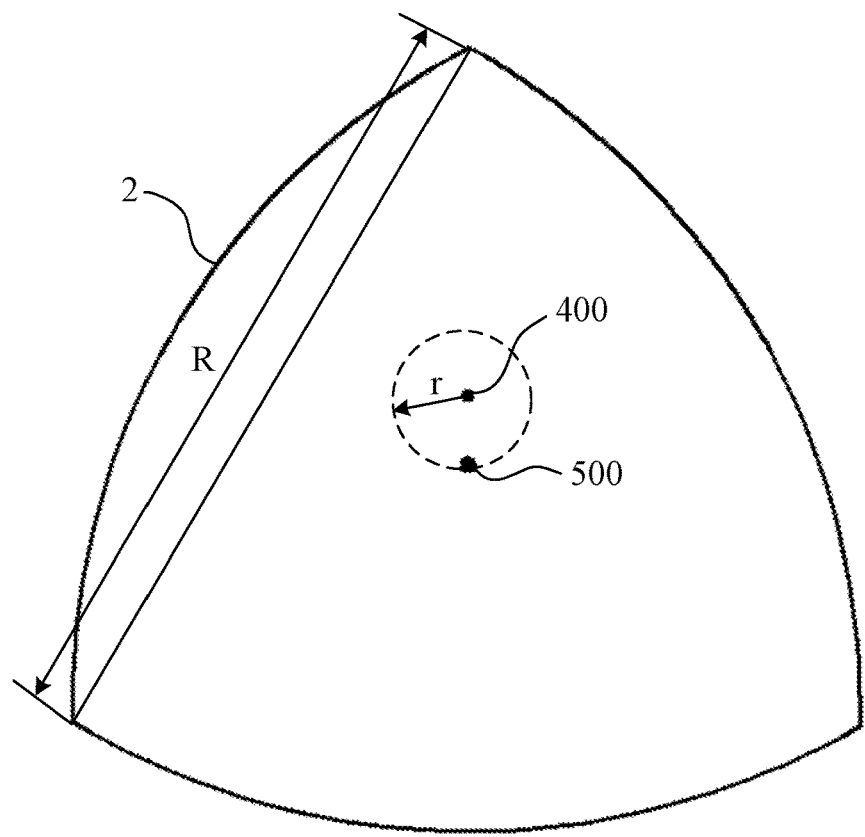
FIG. 4 is a cross sectional view of a film-removing roller in a film-removing device provided by an embodiment of the present disclosure.
Figure 5:
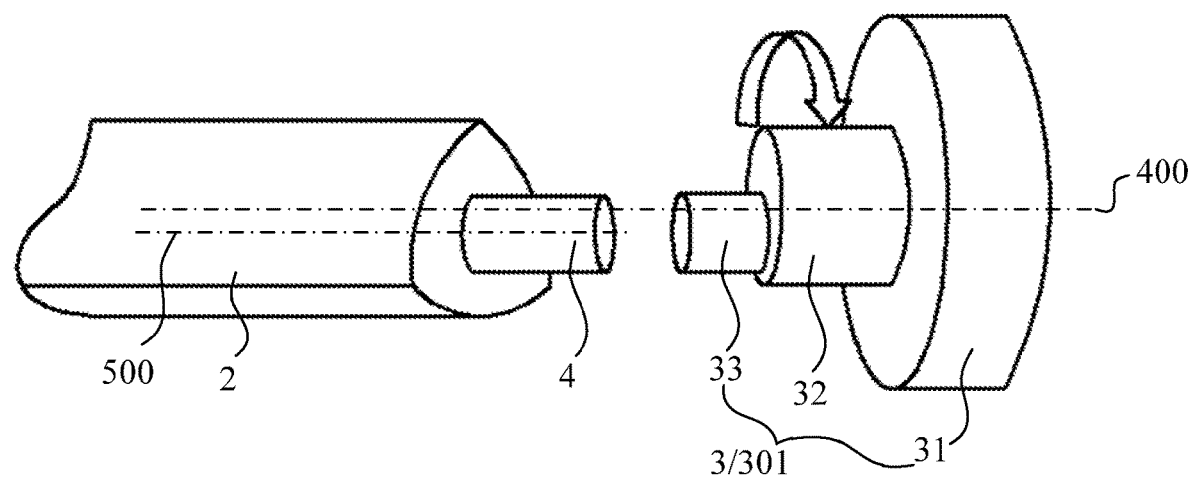
FIG. 5 is a structure view of a film-removing roller and a rotation driver in a film-removing device provided by an embodiment of the present disclosure.

FIG. 2 is a first structural view of a film-removing device provided by an embodiment of the present disclosure, FIG. 3 is a second structural view of a film-removing device provided by an embodiment of the present disclosure; FIG. 4 is a cross sectional view of a film-removing roller in a film-removing device provided by an embodiment of the present disclosure; FIG. 5 is a structure view of a film-removing roller and a rotation driver in a film-removing device provided by an embodiment of the present disclosure.

For example, the film-removing device provided by embodiments of the present disclosure can be used to remove a protective layer 300 on a metal packaging film, the metal packaging film is formed by attaching a metal film 100 and an organic film 200. The protective film 300 is covered on the metal packaging film, and the protective film 300 can be disposed on a surface of the organic film 200 away from the metal film 100.

For example, as illustrated in FIG. 2 and FIG. 3, the film-removing device includes: a load-bearing platform 1, a film-removing roller 2 and a rotation driver 3. The load-bearing platform 1 includes a load-bearing surface 10; the film-removing roller 2 is disposed on a side close to the load-bearing surface 10 of the load-bearing platform 1 (for example, above of the load-bearing surface 10), a central axis of the film-removing roller 2 is parallel to the load-bearing surface 10 of the load-bearing platform 1, the film-removing roller 2 can move horizontally relative to the load-bearing platform 1 in a direction perpendicular to the central axis of the film-removing roller 2 and parallel to the load-bearing surface 10; the rotation driver 3 is connected to the film-removing roller 2, as illustrated in FIG. 4 and FIG. 5, the rotation driver 3 is configured to drive the film-removing roller 2 to rotate around a central line 400 parallel to the central axis 500 of the film-removing roller 2, such that an edge of the film-removing roller 2 close to the load-bearing surface 10 moves within the load-bearing surface 10 of the load-bearing platform 1.

For example, a shape of a cross section of the film-removing roller 2 is a reuleaux triangle, which is not limited thereto, the shape of the cross section of the film-removing roller 2 can also be other curves having a constant width.

For example, as illustrated in FIG. 5, the rotation driver 3 can drive the film-removing roller 2 to make a circular motion around the center line 400 parallel to the central axis 500 of the film-removing roller 2. And the protective film 300 is always pressed by a surface of the film-removing roller 2 during the process of the circular motion of the film-removing roller 2 around the center line 400.

For example, a process of removing the protective film by using the film-removing device provided by the embodiment of the present disclosure may include the following steps. Firstly, the metal packaging film is placed on the load-bearing surface 10 of the load-bearing platform 1 and the protective film 300 on the metal packaging film is disposed on a side of the metal packaging film away from the load-bearing surface 10, that is, the protective film 300 on the metal packaging film is not in contact with the load-bearing surface 10; secondly, the film-removing roller 2 is horizontally moved relative to the load-bearing platform 1 in a direction perpendicular to the central axis of the film-removing roller 2 and parallel to the load-bearing surface 10 to an upper side of a first end edge of the metal packaging film (as illustrate in FIG. 3), and a lower edge of the film-removing roller 2 is in contact with an upper surface of the metal packaging film; and then the protective film 300 is fixed to the film-removing roller 2, and the rotation driver 3 is activated to drive the film-removing roller 2 to make a circular motion around the center line parallel to the central axis of the film-removing roller 2, simultaneously, the film-removing roller 2 is horizontally moved relative to the load-bearing platform 1 toward a second end of the metal packaging film relative to the first end in a direction perpendicular to the central axis of the film-removing roller 2 and parallel to the load-bearing surface 10, to roll and remove the protective film 300 on the metal packaging film. It should be noted that, the film-removing roller 2 does not need to be rotated and rolled over a surface of the entire protective film 300, upon the protective film 300 being separated from the metal packaging film, the film-removing roller 2 can be entirely translated along the surface of the protective film 300 to remove the protective film 300, in this case, the film-removing roller 2 may not rotate.

Because the cross section of the film-removing roller 2 is a reuleaux triangle, the reuleaux triangle has a constant width, so that the metal packaging film is always pressed by the film-removing roller 2 without warping, a possibility of taking up an organic film 200 in the metal packaging film upon removing the protective film 300 is greatly reduced, and the scrap rate of the metal packaging film is reduced; on the other hand, the reuleaux triangle includes three corners, and upon the protective film 300 being removed through the three corners, the protective film 300 has a large peeling angle, and the protective film 300 is easily peeled off.

It should be noted that, for convenience of description, in the embodiments of the present disclosure, a horizontal direction refers to a direction parallel to the load-bearing surface 10 of the load-bearing platform 1, and a vertical direction refers to a direction perpendicular to the load-bearing surface 10 of the load-bearing platform 1.

For example, in the embodiment illustrated in FIG. 2, in order to enable the film-removing roller 2 to be horizontally moved relative to the load-bearing platform 1 in the direction perpendicular to the central axis of the film-removing roller 2 and parallel to the load-bearing surface 10, the load-bearing platform 1 can be fixed, the film-removing roller 2 can be moved, or the load-bearing platform 1 can be moved, the film-removing roller 2 can be fixed, which is not specifically limited here. And, the film-removing roller 2 or the load-bearing platform 1 can be pushed by a hand or driven by an automated device to achieve movement, which is not specifically limited here.

Figure 7:
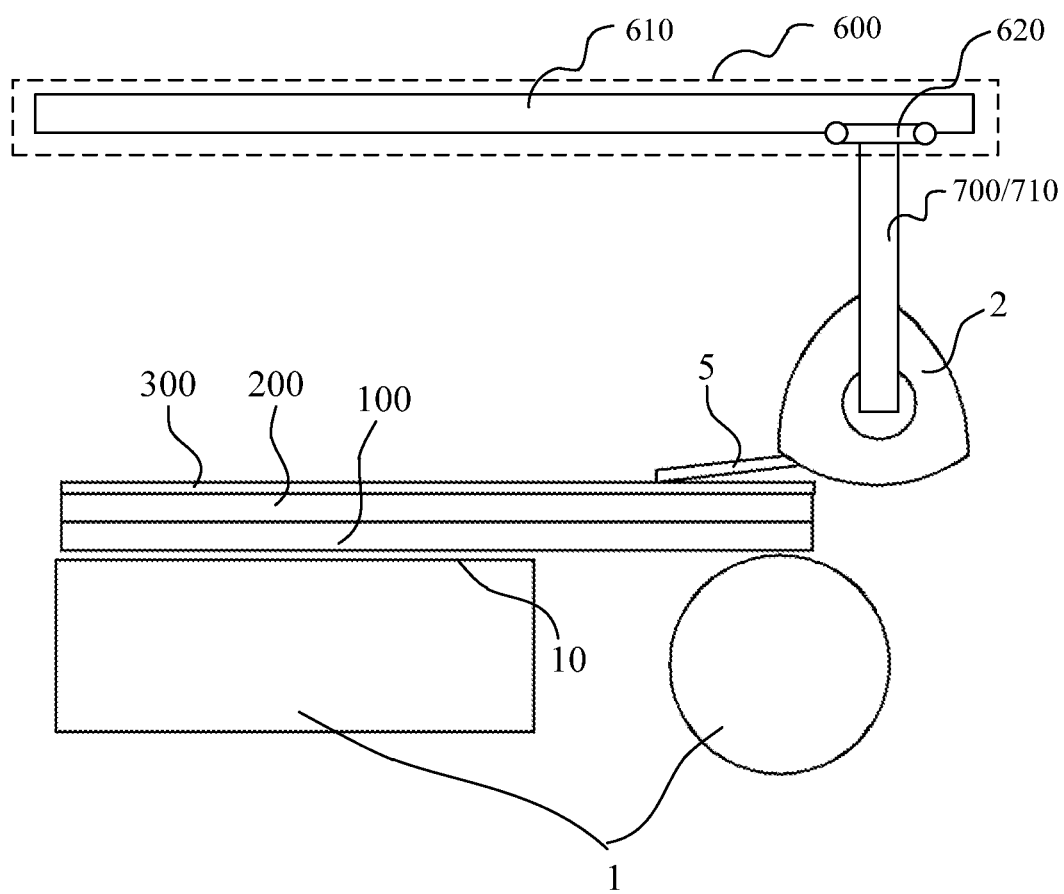
FIG. 7 is a third structure view of a film-removing device provided by an embodiment of the present disclosure.

For example, in order to improve the automaticity of the film-removing device, the film-removing device further includes a horizontal moving assembly, as illustrated by FIG. 7, the film-removing device further includes a horizontal moving assembly 600, including a horizontal rail 610 and a motor 620, the horizontal moving assembly is configured to drive the rotation driver 3 or the load-bearing platform 1 to move horizontally in the direction perpendicular to the central axis of the film-removing roller 2 and parallel to the load-bearing surface 10. In this case, the automatic driving of the film-removing roller 2 or the load-bearing platform 1 in the horizontal direction can be achieved by the horizontal moving assembly, thereby improving the automaticity of the film-removing device.

For example, the horizontal moving assembly is a common structure in the field of mechanical technology, and it has various structural forms, which is not specifically limited here. For example, the horizontal moving assembly may include a motor, a horizontal rail, a horizontal lead screw disposed in the horizontal rail, and a nut matched with the horizontal lead screw. The nut is slidably connected with the horizontal rail, the motor can drive the horizontal lead screw to rotate, and the rotation driver 3 or the load-bearing platform 1 is fixedly connected with the nut. In this case, upon the horizontal lead screw being rotated by the motor, the nut on the horizontal lead screw can be driven to slide along the horizontal rail, thereby driving the rotation driver 3 or the load-bearing platform 1 to move horizontally. For example, the horizontal moving assembly can be a linear motor, a stator of the linear motor is fixedly arranged, and a mover of the linear motor is connected with the rotation driver or the load-bearing platform.

For example, in the embodiment illustrated in FIG. 2, in order to facilitate the pick-and-place of the metal packaging film on the load-bearing platform 1, the film-removing device further includes a vertical moving assembly, as illustrated by FIG. 7, the film-removing device further includes a vertical moving assembly 700, including a vertical cylinder 710, the vertical moving assembly is configured to drive the rotation driver 3 or the load-bearing platform 1 to move in a direction perpendicular to the central axis of the film-removing roller 2 and perpendicular to (for example, a vertical direction) the load-bearing surface 10. In a case that the metal packaging film needs to be taken out from the film-removing roller 2 and the load-bearing platform 1 or the metal packaging film is placed on the load-bearing platform 1, the vertical moving assembly can be activated to drive the load-bearing platform 1 to move downward or drive the rotation driver 3 to move upward to increase a distance between the load-bearing platform 1 and the film-removing roller 2. Therefore, it is convenient to take out the metal packaging film from the load-bearing platform 1 or place the metal packaging film on the load-bearing platform 1.

For example, the vertical moving assembly is a common structure in the field of mechanical technology, and it has various structural forms, which is not specifically limited here. For example, the vertical moving assembly may include a vertical rail and a vertical cylinder fixedly connected to the vertical rail, a piston rod of the vertical cylinder is connected to the rotation driver 3 or the load bearing platform 1, and the rotation driver 3 or the load bearing platform 1 is slidably connected to the vertical rail. In this case, the vertical cylinder can drive the rotation driver 3 or the load bearing platform 1 to slide up and down along the vertical rail. This structure is simple and easy to implement, and the vertical cylinder has a certain cushioning performance, which can reduce a possibility that the film-removing roller 2 connected to the rotation driver 3 presses and damages the metal packaging film on the load-bearing platform 1 due to an excessively large distance of the rotation driver 3 moving toward the load-bearing platform 1.

For example, the rotation driver 3 includes a sub-driving assembly connected to an end of the film-removing roller 2. For example, in order to improve the rotational synchronism of respective positions in an axial extension direction of the film-removing roller 2 upon rotating around the center line 400 to improve the stability of removing film, as illustrated in FIGS. 3 and 5, the rotation driver 3 may include two sub-driving assemblies. As illustrated in FIG. 3, the two sub-driving assemblies are respectively a sub-driving assembly 301 and a sub-driving assembly 302, the two sub-driving assemblies (that is, the sub-driving assembly 301 and the sub-driving assembly 302) are respectively connected to two ends of the film-removing roller 2, and configured to drive the two ends of the film-removing roller 2 to rotate synchronously around the central line 400. In this case, compared with a scheme of driving only one end of the film-removing roller 2 by one sub-driving assembly, the two sub-driving assemblies can improve the rotation synchronization of the respective positions in the axial extension direction of the film-removing roller 2 upon rotating around the center line 400, thereby improving the stability of removing film.

For example, in the embodiment illustrated in FIG. 2, each sub-driving assembly of the rotation driver 3 can include a structure illustrated in FIG. 5, FIG. 5 illustrates the structure of the sub-driving assembly 301. It should be noted that, a structure of the sub-driving assembly 302 can be the same as that of the sub-driving assembly 301 illustrated in FIG. 5. For example, as illustrated in FIG. 5, the sub-driving assembly 301 includes a rotation motor 31 and a turntable 32, the rotation motor 31 is configured to drive the turntable 32 to rotate around a central axis thereof, the end of the film-removing roller 2 is connected to an acentric position of the turntable 32, and the central axis of the turntable 32 is parallel to the central axis of the film-removing roller 2. The central axis of the turntable 32 is the central line 400, upon the turntable 32 being driven to rotate around the central axis thereof by the rotation motor 31, the film-removing roller 2 can be driven to rotate around the center line 400, so that an edge of the film-removing roller 2 close to the load-bearing surface 10 is always moved within the load-bearing surface 10 of the load-bearing platform 1. The structure is simple and easy to implement, and upon the turntable 32 rotating around itself, a centrifugal force of each portion on the turntable 32 is balanced, therefore, the rotation driver 3 has better drive stability, less wear and longer lifetime.

For example, an extension line of the central axis of the turntable 32 of the sub-driving assembly 301 coincides with an extension line of the central axis of the turntable 32 of the sub-driving assembly 302.

For example, in order to connect the film-removing roller 2 to the acentric position of the turntable 32, as illustrated in FIG. 5, the acentric position of the turntable 32 is fixed with a first connecting shaft 33, a central position of an end face of the film-removing roller 2 is fixed with a second connecting shaft 4, and the first connecting shaft 33 and the second connecting shaft 4 are connected through a connector (not illustrated in figures).

It should be noted that, upon the film-removing roller 2 rotating around the central line 400 to make the edge of the film-removing roller 2 close to the load-bearing surface 10 always move within the load-bearing surface 10 of the load-bearing platform 1, as illustrated in FIG. 4, a distance r (that is a radius of a circle upon the central axis 500 making a circular motion) between the central axis 500 and the central line 400 of the film-removing roller 2 and a radius R of an arc of the reuleaux triangle (the cross section of the film-removing roller 2) need to satisfy the following relationship:

$$r = \left(\frac{\sqrt{3}}{3} - \frac{1}{2}\right)R$$

Before using the film-removing device illustrated in FIG. 2 to roll and remove the protective film 300, in order to facilitate fixing the edge of the protective film 300 to the film-removing roller 2, for example, as illustrated in FIG. 2 or FIG. 3, a sidewall of the film-removing roller 2 is provided with a connection structure 5, the connection structure 5 is configured to connect with the protective film 300 on a surface of the metal packaging film. In this case, the edge of the protective film 300 can be fixed on the film-removing roller 2 through the connection structure 5.

For example, in an example, the connection structure 5 can include a vacuum absorbed pore disposed on the sidewall of the film-removing roller 2, the vacuum absorbed pore is connected to a vacuum generator, the vacuum absorbed pore is vacuumed by the vacuum generator, so that the protective film can be adsorbed on the sidewall of the film-removing roller by the vacuum absorbed pore. The structure is simple, and the protective film can be automatically adsorbed to the surface of the film-removing roller without manual operation, therefore, the automaticity is high.

For example, in another example, as illustrated in FIG. 2 or FIG. 3, the connection structure 5 can include an adhesive tape, an end of the adhesive tape is detachably connected to the sidewall of the film-removing roller 2. Thus, the protective film 300 can be attached to the sidewall of the film-removing roller 2 by the adhesive tape detachably connected to the sidewall of the film-removing roller 2. This structure is simple, easy to implement, and low in cost For example, a length of the adhesive tape can be 1 cm, 2 cm or 3 cm and so on, which is not specifically limited here.

Figure 6:
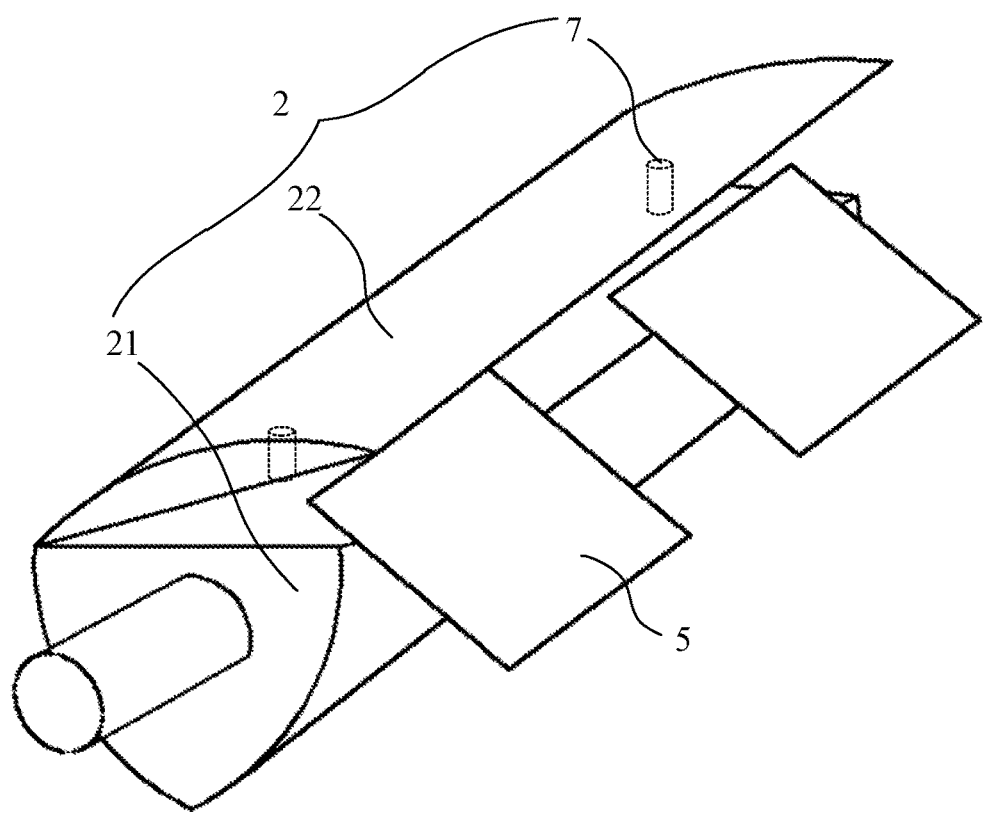
FIG. 6 is a structure view of a film-removing roller and a connection structure in a film-removing device provided by an embodiment of the present disclosure.

For example, in order to achieve a detachable connection between the adhesive tape and the film-removing roller 2, the film-removing roller 2 can be made in a structure illustrated in FIG. 6, that is, the film-removing roller 2 includes a first clamping plate 21, a second clamping plate 22 and a driving mechanism 7, the driving mechanism 7 is connected between the first clamping plate 21 and the second clamping plate 22, and configured to drive the first clamping plate 21 and the second clamping plate 22 to be attached or opened, and upon the first clamping plate 21 and the second clamping plate 22 being attached, an end edge of the adhesive tape is clamped between the first clamping plate 21 and the second clamping plate 22. Upon the film-removing roller 2 being connected with the adhesive tape, the first clamping plate 21 and the second clamping plate 22 can be driven to open by the driving mechanism 7. After the end of the adhesive tape extends between the first clamping plate 21 and the second clamping plate 22, the first clamping plate 21 and the second clamping plate 22 are driven to close to clamp one end edge of the adhesive tape between the first clamping plate 21 and the second clamping plate 22. After the protective film is adhered to the other end of the adhesive tape, the protective film may be removed from the metal packaging film, and then the first clamping plate 21 and the second clamping plate 22 may be opened again to discard the adhesive tape and the protective film adhered to the adhesive tape. The structure is simple, easy to implement, and can achieve automatic clamping and dismounting of the adhesive tape, and has high automaticity, and low labor intensity.

For example, in the abovementioned embodiments, the driving mechanism 7 can be a cylinder, a hydraulic cylinder, an electric push rod, etc. connected between the first clamping plate 21 and the second clamping plate 22, which is not specifically limited. However, in order to have a certain buffering capacity between the first clamping plate 21 and the second clamping plate 22, and in order to ensure the environmental cleanliness of the film-removing device, the driving mechanism 7 is a cylinder. Compared with the electric push rod, the cylinder has a certain buffering capacity. Compared with the hydraulic cylinder, a working medium of the cylinder is usually air, the cost of the air is low, and the environment of the film-removing device is not affected upon leaking.

For example, in the embodiment illustrated in FIG. 2, in order to reduce the possibility that the film-removing device takes up the organic film 200 in a process of removing the protective film 300, for example, as illustrated in FIG. 3, the film-removing device further includes a heating assembly 6, configured to heat the film-removing roller 2. In this case, the film-removing roller 2 can be heated by the heating assembly 6 while rolling and removing the protective film 300, so as to raise a temperature of a rolling region. Thereby, the adhesion between the metal film and the organic film at the rolling region can be increased, and the possibility of taking up the organic film during the process of removing the protective film 300 is further reduced.

For example, the heating assembly 6 can include a heating tube, a shape of the heating tube may be a block shape, a long strip shape, a spherical shape, or the like, which is not specifically limited here. In order to increase the heating uniformity of the heating assembly 6 in the axial extension direction of the film-removing roller 2, as illustrated in FIG. 3, an elongated hole is formed in the film-removing roller 2, and the elongated hole extends from one end of the film-removing roller 2 to the other end of the film-removing roller 2, and the heating tube has a strip shape, a length of the heating tube matches a length of the elongated hole, and the heating tube is installed in the elongated hole. Thus, the heating uniformity of the heating assembly 6 in the axial extension of the film-removing roller 2 is increased by a case that the heating assembly 6 is disposed in the film-removing roller 2 and extended from one end of the film-removing roller 2 to the other end of the film-removing roller 2.

For example, in the abovementioned embodiment, the heating assembly 6 may also include a heating rod, a heating wire, and the like, which is not specifically limited. And in order to further increase the heat uniformity of the heating assembly 6, as illustrated in FIG. 3, the central axis of the elongated hole coincides with the central axis of the film-removing roller 2, thereby installing the heating assembly 6 at the center position of the film-removing roller 2, which can further improve the heating uniformity of the heating assembly 6.

In the description of the specification, specific features, structures, or characteristics may be combined in a suitable manner in any one or more embodiments or examples.

The foregoing is only the embodiments of the present disclosure and not intended to limit the scope of protection of the present disclosure, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. A film-removing device, comprising:
   a load-bearing platform comprising a load-bearing surface;
   a film-removing roller, provided at a side of the load-bearing platform where the load-bearing surface is located, a central axis of the film-removing roller being parallel to the load-bearing surface of the load-bearing platform; and
   a rotation driver, connected to the film-removing roller, and configured to drive the film-removing roller to rotate around a central line parallel to the central axis of the film-removing roller, such that an edge of the film-removing roller facing the load-bearing surface moves within the load-bearing surface of the load-bearing platform.

2. The film-removing device according to claim 1, wherein a shape of a cross section of the film-removing roller is a reuleaux triangle, the cross section is perpendicular to the central axis.

3. The film-removing device according to claim 2, further comprising: a horizontal moving assembly,
   wherein the horizontal moving assembly is configured to drive the rotation driver or the load-bearing platform to move in a direction perpendicular to the central axis of the film-removing roller and parallel to the load-bearing surface.

4. The film-removing device according to claim 2, wherein the rotation driver comprises a sub-driving assembly connected to an end of the film-removing roller, the sub-driving assembly comprises a rotation motor and a turntable, the rotation motor is configured to drive the turntable to rotate around a central axis thereof, the end of the film-removing roller is connected to an acentric position of the turntable, and the central axis of the turntable is parallel to the central axis of the film-removing roller.

5. The film-removing device according to claim 2, wherein the rotation driver comprises two sub-driving assemblies respectively connected to two ends of the film-removing roller and configured to drive the two ends of the film-removing roller to rotate synchronously around the central line.

6. The film-removing device according to claim 1, further comprising: a horizontal moving assembly,
wherein the horizontal moving assembly is configured to drive the rotation driver or the load-bearing platform to move in a direction perpendicular to the central axis of the film-removing roller and parallel to the load-bearing surface.

7. The film-removing device according to claim 6, further comprising: a vertical moving assembly,
wherein the vertical moving assembly is configured to drive the rotation driver or the load-bearing platform to move in a direction perpendicular to the central axis of the film-removing roller and perpendicular to the load-bearing surface.

8. The film-removing device according to claim 1, further comprising: a vertical moving assembly,
wherein the vertical moving assembly is configured to drive the rotation driver or the load-bearing platform to move in a direction perpendicular to the central axis of the film-removing roller and perpendicular to the load-bearing surface.

9. The film-removing device according to claim 1, wherein the rotation driver comprises a sub-driving assembly connected to an end of the film-removing roller, the sub-driving assembly comprises a rotation motor and a turntable, the rotation motor is configured to drive the turntable to rotate around a central axis thereof, the end of the film-removing roller is connected to an acentric position of the turntable, and the central axis of the turntable is parallel to the central axis of the film-removing roller.

10. The film-removing device according to claim 1, wherein the rotation driver comprises two sub-driving assemblies respectively connected to two ends of the film-removing roller and configured to drive the two ends of the film-removing roller to rotate synchronously around the central line.

11. The film-removing device according to claim 10, wherein each sub-driving assembly comprises a rotation motor and a turntable, the rotation motor is configured to drive the turntable to rotate around a central axis thereof, an end of the film-removing roller is connected to an acentric position of the turntable, and the central axis of the turntable is parallel to the central axis of the film-removing roller.

12. The film-removing device according to claim 1, wherein a sidewall of the film-removing roller is provided with a connection structure, the connection structure is configured to connect to a protective film.

13. The film-removing device according to claim 12, wherein the connection structure comprises an adhesive tape, an end of the adhesive tape is detachably connected to the sidewall of the film-removing roller.

14. The film-removing device according to claim 13, wherein the film-removing roller comprises a first clamping plate, a second clamping plate and a driving mechanism, the driving mechanism is connected between the first clamping plate and the second clamping plate, and configured to drive the first clamping plate and the second clamping plate to clamp or open, and upon the first clamping plate and the second clamping plate being clamped with each other, an end edge of the adhesive tape is clamped between the first clamping plate and the second clamping plate.

15. The film-removing device according to claim 12, wherein the protective film covers on a metal packaging film.

16. The film-removing device according to claim 1, further comprising a heating assembly,
wherein the heating assembly is configured to heat the film-removing roller.

17. The film-removing device according to claim 16, wherein an elongated hole is formed in the film-removing roller, and the elongated hole extends from one end of the film-removing roller to the other end of the film-removing roller, and the heating assembly comprises a heating tube having a strip shape and installed in the elongated hole.

18. The film-removing device according to claim 17, wherein a length of the heating tube matches a length of the elongated hole.

* * * * *